United States Patent
Li et al.

(10) Patent No.: US 11,158,540 B2
(45) Date of Patent: Oct. 26, 2021

(54) LIGHT-ABSORBING MASK FOR HYBRID LASER SCRIBING AND PLASMA ETCH WAFER SINGULATION PROCESS

(71) Applicant: APPLIED MATERIALS, INC., Santa Clara, CA (US)

(72) Inventors: Wenguang Li, Milpitas, CA (US); James S. Papanu, San Rafael, CA (US); Wei-Sheng Lei, SanJose, CA (US); Prabhat Kumar, Fremont, CA (US); Brad Eaton, Menlo Park, CA (US); Ajay Kumar, Cupertino, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 274 days.

(21) Appl. No.: 15/606,456

(22) Filed: May 26, 2017

(65) Prior Publication Data

US 2018/0342422 A1    Nov. 29, 2018

(51) Int. Cl.
*H01L 21/78* (2006.01)
*H01L 21/311* (2006.01)
(Continued)

(52) U.S. Cl.
CPC ........ *H01L 21/78* (2013.01); *H01L 21/02076* (2013.01); *H01L 21/268* (2013.01);
(Continued)

(58) Field of Classification Search
None
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Jay C Chang
(74) *Attorney, Agent, or Firm* — Schwabe, Williamson & Wyatt, P.C.

(57) ABSTRACT

Light-absorbing masks and methods of dicing semiconductor wafers are described. In an example, a method of dicing a semiconductor wafer including a plurality of integrated circuits involves forming a mask above the semiconductor wafer. The mask includes a water-soluble matrix based on a solid component and water, and a light-absorber species throughout the water-soluble matrix. The mask and a portion of the semiconductor wafer are patterned with a laser scribing process to provide a patterned mask with gaps and corresponding trenches in the semiconductor wafer in regions between the integrated circuits. The semiconductor wafer is plasma etched through the gaps in the patterned mask to extend the trenches and to singulate the integrated circuits. The patterned mask protects the integrated circuits during the plasma etching.

17 Claims, 9 Drawing Sheets

(51) Int. Cl.
*H01L 21/02* (2006.01)
*H01L 21/268* (2006.01)
*H01L 21/3065* (2006.01)
*H01L 21/308* (2006.01)

(52) U.S. Cl.
CPC ...... *H01L 21/3065* (2013.01); *H01L 21/3081* (2013.01); *H01L 21/3086* (2013.01); *H01L 21/31127* (2013.01)

(56) References Cited

U.S. PATENT DOCUMENTS

| | | | |
|---|---|---|---|
| 4,684,437 A | 8/1987 | Donelon et al. | |
| 4,990,417 A * | 2/1991 | Inada | G03F 7/11 313/364 |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Poweli | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 9,130,030 B1 * | 9/2015 | Park | H01L 21/78 |
| 2001/0003643 A1 * | 6/2001 | Kita | B41C 1/1016 430/273.1 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0120271 A1 | 5/2007 | Kozakai et al. | |
| 2009/0255911 A1 | 10/2009 | Krishnaswami et al. | |
| 2010/0013036 A1 | 1/2010 | Carey | |
| 2010/0062269 A1 * | 3/2010 | Ogita | B32B 27/10 428/452 |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0299088 A1 | 11/2013 | Lei et al. | |
| 2014/0273401 A1 * | 9/2014 | Lei | H01L 21/30655 438/462 |
| 2015/0214111 A1 | 7/2015 | Lei et al. | |
| 2016/0307851 A1 * | 10/2016 | Ohura | H01L 21/78 |
| 2016/0365283 A1 * | 12/2016 | Lei | H01L 21/82 |

FOREIGN PATENT DOCUMENTS

| | | |
|---|---|---|
| JP | 2001127011 | 5/2001 |
| JP | 2001144126 | 5/2001 |
| JP | 2002221801 A | 8/2002 |
| JP | 2003179005 | 6/2003 |
| JP | 2004031526 | 1/2004 |
| JP | 2004055684 | 2/2004 |
| KR | 10-20100121939 A | 11/2010 |
| WO | WO-03036712 | 5/2003 |
| WO | WO-03071591 | 5/2003 |
| WO | WO 2017/196549 | 11/2017 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

U.S. Appl. No. 15/154,790 entitled "Etch Mask for Hybrid Laser Scribing and Plasma Etch Wafer Singulation Process," filed May 13, 2016, 45 pgs.

International Search Report and Written Opinion from PCT/US2018/032444 dated Sep. 14, 2018, 12 pgs.

International Preliminary Report on Patentability from International Application No. PCT/US2018/032444 dated Dec. 5, 2019, 9 pgs.

Extended European Search Report from European Patent Application No. 18805731 dated Jan. 28, 2021, 8 pgs.

* cited by examiner

LIGHT-ABSORBING MASK FOR HYBRID LASER SCRIBING AND PLASMA ETCH WAFER SINGULATION PROCESS

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma etching of commonly encountered metals (e.g., copper) in dicing along streets can create production issues or throughput limits.

SUMMARY

Embodiments of the present invention include methods of, and apparatuses for, dicing semiconductor wafers.

In an embodiment, a method of dicing a semiconductor wafer including a plurality of integrated circuits involves forming a mask above the semiconductor wafer. The mask includes a water-soluble matrix based on a solid component and water, and a light-absorber species throughout the water-soluble matrix. The mask and a portion of the semiconductor wafer are patterned with a laser scribing process to provide a patterned mask with gaps and corresponding trenches in the semiconductor wafer in regions between the integrated circuits. The semiconductor wafer is plasma etched through the gaps in the patterned mask to extend the trenches and to singulate the integrated circuits. The patterned mask protects the integrated circuits during the plasma etching.

In another embodiment, a method of dicing a semiconductor wafer including a plurality of integrated circuits involves forming a mask above the semiconductor wafer. The mask includes a water-soluble matrix based on a solid component and water, and a light-absorber species throughout the water-soluble matrix. The mask is patterned and the integrated circuits of the semiconductor wafer are singulated with a laser scribing process.

In another embodiment, a mask for a wafer singulation process includes a water-soluble matrix based on a solid component and water. A light-absorber species is throughout the water-soluble matrix. A plurality of particles is dispersed throughout the water-soluble matrix. The plurality of particles is different from the light-absorber species.

DETAILED DESCRIPTION

Figure 1:
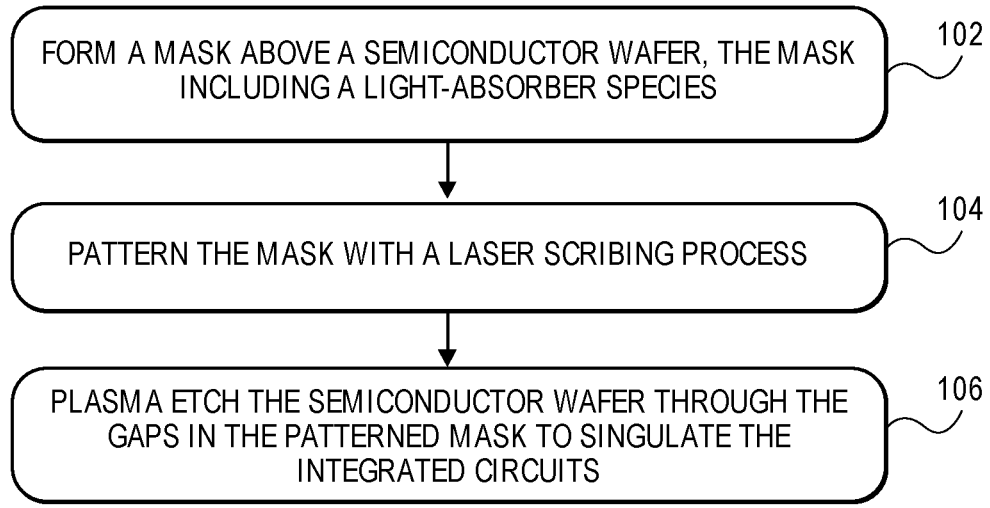
FIG. 1 is a Flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as light-absorbing mask materials and treatments, laser scribing conditions, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments are directed particularly to using light-absorbers to reduce laser damage in etch masks. Embodiments may be applicable to laser and etch wafer dicing approaches and tooling for singulation or dicing of electronic device wafers.

To provide context, during singulation of a wafer into individual die, the wafer is cut or sectioned along dicing streets between the dies. Traditionally, dicing has been performed with a mechanical saw. Mobile devices and other technology drivers may require more advanced singulation approaches to reduce cracking, delamination, and chipping defects. A laser and etch wafer dicing approach may involve applying a water soluble protective coating to a substrate, removing the coating and device test layers in the street regions removed by laser scribing to open up the underlying substrate material, which is typically silicon (Si). The exposed Si is then plasma etched through its entire thickness to singulate the wafer into the individual die. The protective coating is removed in a deionized (DI) water based cleaning operation. Water soluble protective coatings may be desirable due to environmental considerations and ease of processing. Such a water soluble coating may primarily be used as an etch mask during the plasma etching step, and also as a layer that collects any debris generated during laser scribing.

To provide further context, femtosecond lasers may be preferred in the laser scribing portion of the process. Unlike nanosecond and other long pulse lasers, femtosecond lasers have little heat effect because of the associated ultra-short pulses. Another advantage of femtosecond lasers may be the capability to remove most materials including absorptive, reflective and transparent materials. On typical wafers, there are metals which are reflective and absorptive, the dielectrics which are transparent, and the silicon substrate which is absorptive to most laser light. The water-soluble protective coating is totally or mostly transparent. These listed materials can be ablated by femtosecond lasers.

Typical femtosecond lasers have a so-called "Gaussian beam," which has high intensity near the center of the beam and low intensity toward the edge of the beam. Gaussian beams may become problematic when a femtosecond laser is used to process wafers with transparent layers on absorptive substrates, for example, a transparent protecting coating (e.g., water-soluble mask) on silicon or on dielectric layers on silicon. In order to remove the transparent layer(s), a laser process requires a suitably high intensity (e.g., leading portion of a Gaussian beam) to produce nonlinear absorption. However, since the low intensity portion (trailing portion) of the Gaussian beam does not have enough intensity to produce nonlinear absorption, the low intensity portion of the Gaussian beam passes through transparent layers with little attenuation. However, the low intensity portion of the Gaussian beam is absorbed by silicon. Such a scenario can cause heating of the transparent layer/silicon interface which can lead to delamination between the transparent layers and silicon, and to chipping or even cracking in both transparent layers and silicon. As a result, the Gaussian beam typically produces a laser damaged area, which is much wider than the intended scribe area. In another embodiment, however, the laser is not a Gaussian beam, but instead a non-Gaussian beam having high intensity portions and low intensity portions.

In accordance with one or more embodiments of the present invention, light absorbers are used in a protective coating, such as in a water-soluble mask, to prevent the low intensity portion of the Gaussian beam from reaching the transparent layer/silicon interface. In one such embodiment, a laser damaged zone is significantly reduced or removed altogether. In an embodiment, inclusion of light-absorber species in an otherwise transparent mask material enables a scribing process where a trailing portion of a Gaussian beam is kept in or confined to a mask during laser scribing, and permitting only a leading portion of the Gaussian beam to penetrate into substrate.

It is to be appreciated that although many embodiments described below are associated with femto-second laser scribing, in other embodiments, laser scribing with other laser beam types may also be compatible with masking materials described herein. It is also to be appreciated that although many embodiments described below are associated with scribing streets having metallized features, in other embodiments, metal free scribing streets may also be considered.

Figure 2A:
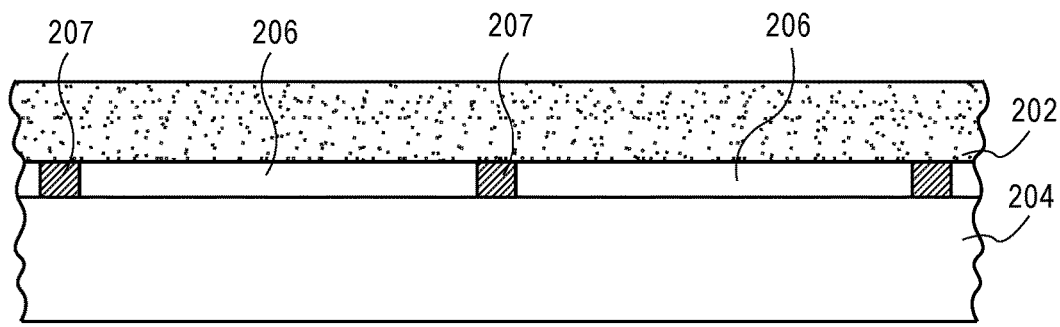
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
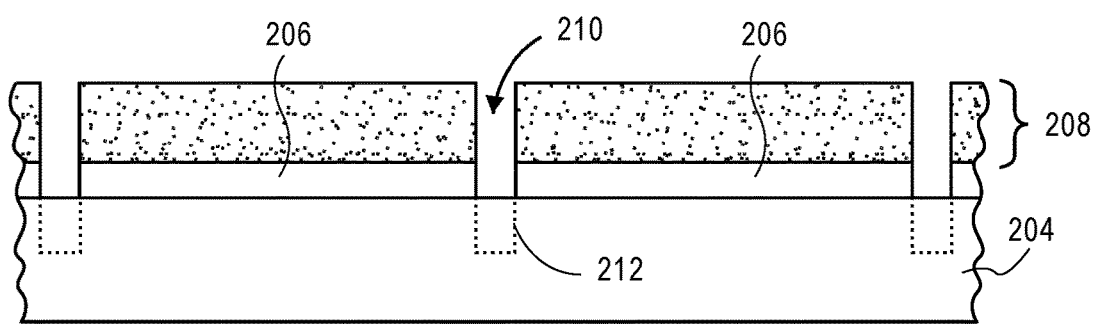
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
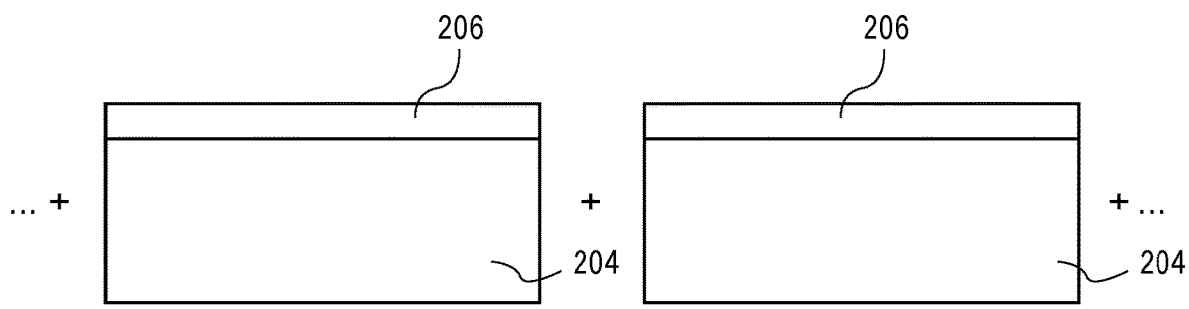
FIG. 2C illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present invention.

As such, in an aspect of the present invention, a light-absorbing mask is used for a singulation process based on a combination of a laser scribing process with a plasma etching process to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 covers and protects integrated circuits 206 formed on the surface of semiconductor wafer 204. The mask 202 also covers intervening streets 207 formed between each of the integrated circuits 206. In an embodiment, the mask 202 includes a water-soluble matrix based on a solid component and water, and a light-absorber species throughout the water-soluble matrix.

In one embodiment, the water soluble matrix is a polyvinyl alcohol (PVA)-based water soluble matrix, where the PVA is the solid component. In another embodiment, the solid component for the water soluble matrix is selected from the group consisting of polyethylene oxide, polyethylene glycol, polyacrylic acid, polyacrylamide, polystyrene-maleic acid copolymer, hydroxyethyl cellulose and hydroxyethyl starch. In one embodiment, the water-soluble matrix includes approximately 10-40 weight % of the solid component with the remainder water.

In one embodiment, forming the mask 202 above the semiconductor wafer 204 includes spin-coating the mask 202 on the semiconductor wafer 204. In a specific embodiment, prior to coating, a plasma or chemical pre-treatment is performed to enable better wettability and coating of the wafer.

In an embodiment, mask 202 is a water soluble mask in that it is readily dissolvable in an aqueous media. For example, in one embodiment, the as deposited water-soluble mask 202 is composed of a material that is soluble in one or more of an alkaline solution, an acidic solution, or in deionized water. In a specific embodiment, the as-deposited water-soluble mask 202 has an etch or removal rate in an aqueous solution approximately in the range of 1-15 microns per minute and, more particularly, approximately 1.3 microns per minute.

In an embodiment, the light-absorber species throughout the water-soluble matrix of the mask 202 is a species such as, but not limited to a water-soluble dye dissolved in the water-soluble matrix, a nano-dispersion of pigments throughout the water-soluble matrix, or a combination of a water soluble dye dissolved in the water-soluble matrix and a nano-dispersion of pigments throughout the water-soluble matrix.

In an embodiment, for a 530 nanometer green laser, the light absorber species is selected from the group consisting of Rhodamine B, Rhodamine G, and D&C red 27. In an embodiment, for a 530 nanometer green laser, the light absorber species is selected from the group of dyes or pigments that absorb 530 nm light, where examples of dyes are Rhodamine B, Rhodamine G, betanin and D&C red 27. It is to be appreciated that since a relatively larger pigment dispersion may scatter light and have a negative effect on wafer alignment, water-soluble dyes may be preferred light absorbers. However, in an embodiment, a nano-dispersion of pigments (dispersion of pigment particles having a size on the nanometer scale) is used and exhibits relatively low light scattering. In one embodiment, the dispersion of pigment particles is composed of carbon black, iron oxide, or gold colloids. In an embodiment, a dispersion of $CeO_2$ particles is used as a UV-absorbing species.

In an additional aspect, typical water soluble polymers do not have high resistance to plasma etching, while polymers that have good etch resistance are typically not soluble in water. Etch selectivity may be defined as the ratio of the amount of substrate material (e.g., Si) removed to the amount of mask loss during the etch process. Water soluble polymers typically have relatively low selectivity, and it may be advantageous to enhance the selectivity of the mask without sacrificing water solubility.

In accordance with an embodiment of the present invention, a light-absorbing water soluble mask has additional particles therein provided for etch selectivity for laser scribing and plasma etching wafer singulation. Embodiments may address potential needs for improved etch resistance in a water soluble dicing mask. In a specific example, a polyvinyl alcohol (PVA) matrix with silica particles dispersed therein is provided as an etch mask. More generally, in an embodiment, particle dispersions are mixed with water soluble polymers to form a composite mask. Materials such as oxides and polymers, which are not water soluble, can be incorporated into water soluble polymer mixtures as dispersions. Suitable particle dispersions may be colloidal dispersions of inorganic particles and polymers. Suitable inorganic particles may include oxide, such as silicon oxide, aluminum oxide, titanium oxide, and cerium oxide, and other particles such as calcium carbonate, barium sulfate, etc. Suitable polymer particles may include polystyrene and PTFE. It is to be appreciated that low haze is usually required for the mask since the mask is laser scribed. To minimize haze, in an embodiment, particles smaller than 100 nanometers may be included in the matrix.

Thus, in an embodiment, a plurality of particles is dispersed throughout the water-soluble matrix of the mask that includes light-absorber species. The plurality of particles is different from the light-absorber species. In one embodiment, the plurality of particles has an average diameter approximately in the range of 5-100 nanometers. In one embodiment, a ratio of weight % of the solid component of the water-soluble matrix to weight % of the plurality of particles is approximately in the range of 1:0.1-1:4. In one embodiment, the plurality of particles has an average diameter approximately in the range of 5-100 nanometers, and a ratio of weight % of the solid component of the water-soluble matrix to weight % of the plurality of particles is approximately in the range of 1:0.1-1:4. In one embodiment, the plurality of particles has an average diameter approximately in the range of 5-50 nanometers. It is to be appreciated that a smaller diameter may be preferable in order to mitigate or negate any potential laser light scattering or haze. In one embodiment, the ratio of weight % of the solid component to weight % of the plurality of particles is approximately in the range of 1:0.5-1:2.

In one embodiment, the plurality of particles is a plurality of particles selected from the group consisting of silica ($SiO_2$) particles, alumina ($Al_2O_3$) particles, alumina-coated silicon particles, polytetrafluoroethylene (PTFE) particles, and combinations thereof. It is to be appreciated that other oxides, such as titanium oxide, cerium oxide, zinc oxide, indium tin oxide, zirconium oxide, and other inorganic particles such as calcium carbonate, barium sulfate, etc., may also be used as particle additives. Suitable polymer particles also include polystyrene, epoxies, etc. In one embodiment, the plurality of particles is a plurality of absorber species.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

In an optional embodiment, the mask 202 is baked prior to laser patterning of the mask. In an embodiment, the mask 202 is baked to increase the etch resistance of the mask 202. In a specific embodiment, the mask 202 is baked at a relatively high temperature approximately in the range of 50 to 130 degrees Celsius. Such higher temperature baking may cause crosslink of the mask 202 so as to significantly increase etch resistance. For example, when the mask 202 is baked at or near 130 degrees Celsius for approximately 3 minutes, the resulting enhanced light-absorbing and etch resistant mask is robust against a silicon etch process. In one embodiment, baking is performed using a hot plate technique or a heat (light) radiation applied from the wafer front side (e.g., non-tape mounted side in the case of the use of a substrate carrier) or other suitable techniques.

Referring to operation 104 of Flowchart 100, and corresponding FIG. 2B, the mask 202 is patterned with a laser scribing process to provide patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the laser scribing process further includes forming trenches 212 partially into the regions of the semiconductor wafer 204 between the integrated circuits 206, as is also depicted in FIG. 2B.

In an embodiment, the mask 202 is patterned with a Gaussian laser beam. The light-absorber species of the mask substantially confines a trailing portion of the Gaussian beam to the mask 202 during the patterning. A leading portion of the Gaussian beam is substantially confined to the semiconductor wafer or substrate 204 during the patterning. In an embodiment, in the case where the mask 202 further includes a plurality of particles for increasing etch resistance, the plurality of particles of the mask 202 does not substantially interfere with the laser scribing process during the patterning of the mask 202 with the laser scribing process.

In an embodiment, a femtosecond-based laser is used as a source for a laser scribing process. For example, in an embodiment, a laser with a wavelength in the visible spectrum plus the ultra-violet (UV) and infra-red (IR) ranges (totaling a broadband optical spectrum) is used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Figure 3A:
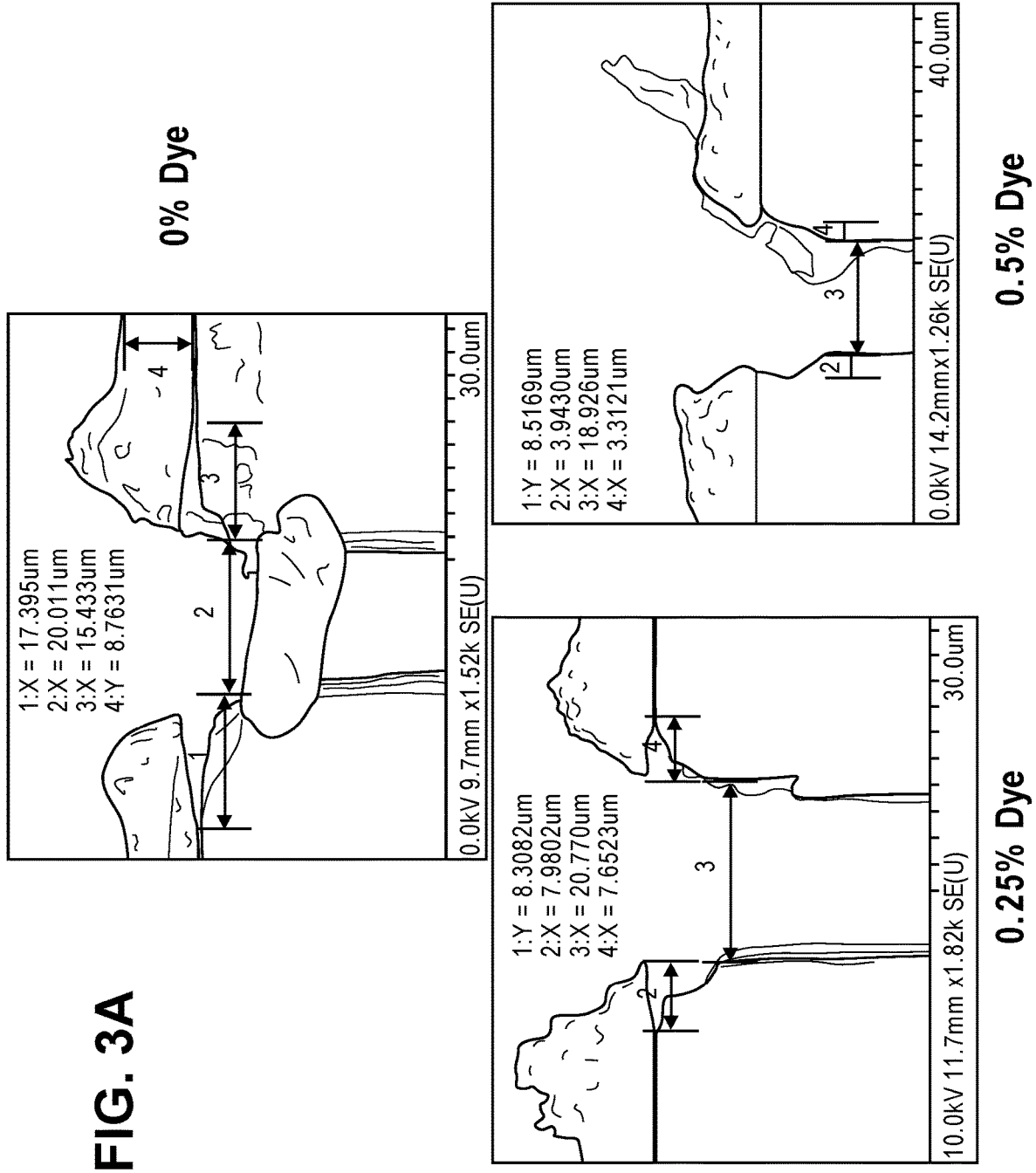
FIG. 3A illustrates scanning electron microscope (SEM) images taken from a trench profile perspective following laser scribing but prior to mask removal for dye concentrations of 0%, 0.25% and 0.5%, in accordance with an embodiment of the present invention.
Figure 3B:
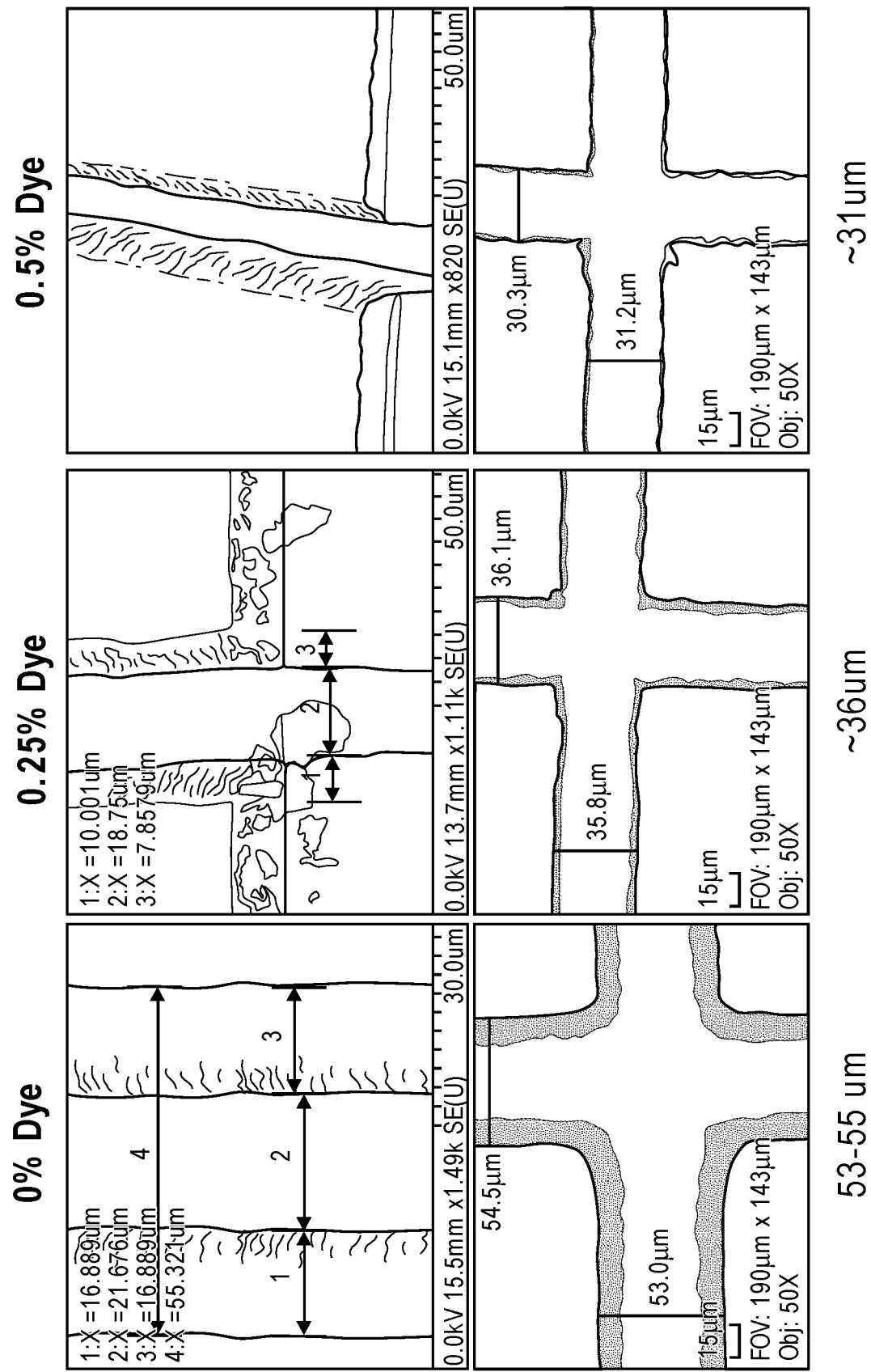
FIG. 3B illustrates scanning electron microscope (SEM) images and optical microscope images of trench surfaces following laser scribing mask removal for dye concentrations of 0%, 0.25% and 0.5%, in accordance with an embodiment of the present invention.

In order to determine the effect of light absorbers on a laser scribe process, e.g., as relative amounts of a light-absorber, liquid coatings were prepared with and without light-absorber species and were then tested in a scribing environment. FIG. 3A illustrates scanning electron microscope (SEM) images taken from a trench profile perspective following laser scribing but prior to mask removal for dye concentrations of 0%, 0.25% and 0.5%, in accordance with an embodiment of the present invention. FIG. 3B illustrates scanning electron microscope (SEM) images and optical microscope images of trench surfaces following laser scribing mask removal for dye concentrations of 0%, 0.25% and 0.5%, in accordance with an embodiment of the present invention.

Referring to FIGS. 3A and 3B, transparent water-soluble mask samples were prepared to include no light absorber, 0.25 weight % light absorber and 0.5 weight % light absorber. The light absorber used was D&C Red 27. The water soluble mask materials were coated on bare silicon (Si) wafers with the coating materials. The coatings were baked to dry. A laser scribe process was used to open the mask material. A plasma etch was performed to achieve a desired trench etch depth in the Si. The wafers were cleaved/cross-sectioned into samples to obtain SEM images and measurements of the width of laser affected areas. As shown in FIGS. 3A and 3B, 0.5% D&C red 27 significantly reduces the width of the laser damaged zones.

It is to be appreciated that by using a laser beam profile with contributions from the femtosecond range, heat damage issues are mitigated or eliminated versus longer pulse widths (e.g., nanosecond processing). The elimination or mitigation of damage during laser scribing may be due to a lack of low energy recoupling or thermal equilibrium. It is also to be appreciated that laser parameter selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 4 illustrates a cross-sectional view of a stack of materials that may be used in a street region of a semiconductor wafer or substrate, in accordance with an embodiment of the present invention.

Figure 4:
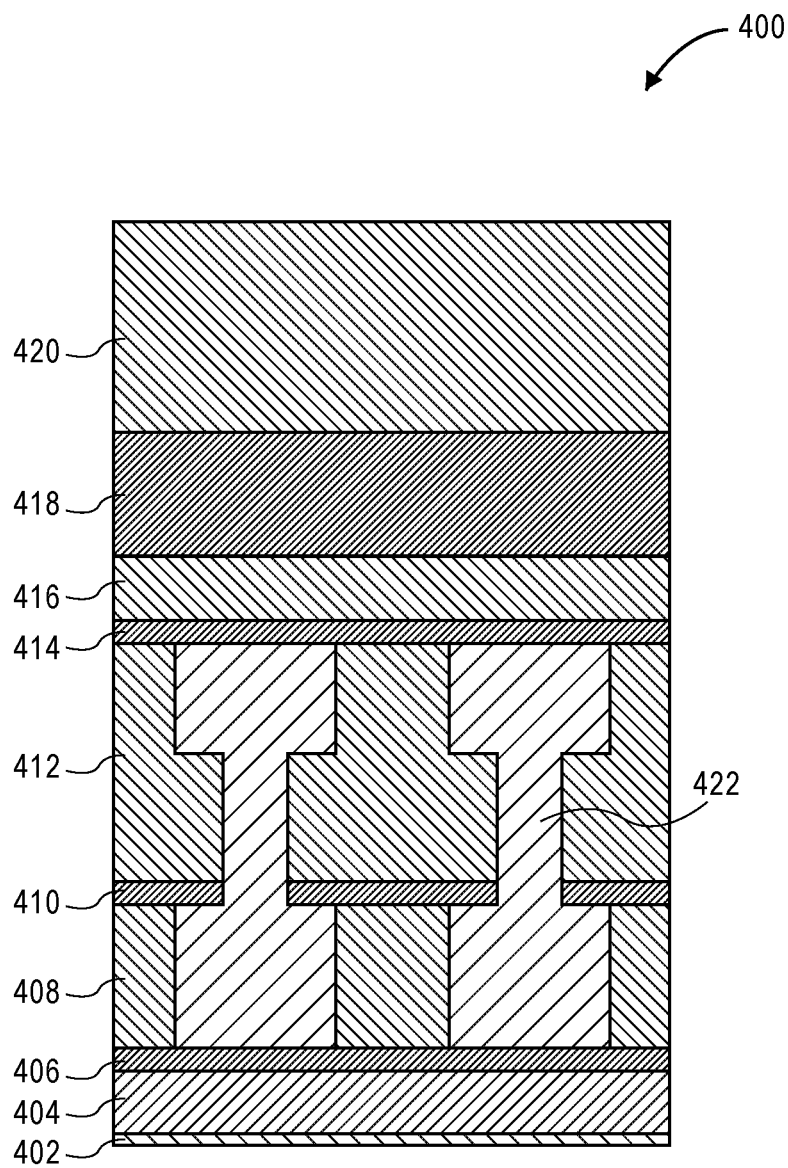
FIG. 4 illustrates a cross-sectional view of a stack of materials that may be used in a street region of a semiconductor wafer or substrate, in accordance with an embodiment of the present invention.

Referring to FIG. 4, a street region 400 includes the top portion 402 of a silicon substrate, a first silicon dioxide layer 404, a first etch stop layer 406, a first low K dielectric layer 408 (e.g., having a dielectric constant of less than the dielectric constant of 4.0 for silicon dioxide), a second etch stop layer 410, a second low K dielectric layer 412, a third etch stop layer 414, an undoped silica glass (USG) layer 416, a second silicon dioxide layer 418, and a scribing and/or etch mask 420 (such as a mask described above in association with mask 202). Copper metallization 422 is disposed between the first and third etch stop layers 406 and 414 and through the second etch stop layer 410. In a specific embodiment, the first, second and third etch stop layers 406, 410 and 414 are composed of silicon nitride, while low K dielectric layers 408 and 412 are composed of a carbon-doped silicon oxide material.

Under conventional laser irradiation (such as nanosecond-based irradiation), the materials of street 400 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based irradiation. In an embodiment, a femto-second based laser scribing process is used to pattern a layer of silicon dioxide, a layer of low K material, and a layer of copper by ablating the layer of silicon dioxide prior to ablating the layer of low K material and the layer of copper.

In case that the laser beam it is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth.

It is to be appreciated that the dicing or singulation process could be stopped after the above described laser scribing in a case that the laser scribing is used to pattern the mask as well as to scribe fully through the wafer or substrate in order to singulate the dies. In accordance with such an approach, in an embodiment, a method of dicing a semiconductor wafer including a plurality of integrated circuits involves forming a mask above the semiconductor wafer. The mask includes a water-soluble matrix based on a solid component and water, and a light-absorber species throughout the water-soluble matrix. The mask is patterned and the integrated circuits of the semiconductor wafer are singulated with a laser scribing process. In a particular such embodiment, the mask is patterned with a Gaussian beam. The light-absorber species of the mask substantially confines a trailing portion of the Gaussian beam to the mask during the patterning. A leading portion of the Gaussian beam is substantially confined to the semiconductor wafer during the patterning. The laser scribing completes the singulation.

Accordingly, in an embodiment, further singulation processing such as plasma etching to effect singulation is not required. However, the embodiments that follow may be considered in cases where laser scribing alone is not implemented for total singulation.

In an optional embodiment, subsequent to the laser scribing process and prior to a plasma etching singulation process, an intermediate post mask-opening cleaning operation is performed. In an embodiment, the post mask-opening cleaning operation is a plasma-based cleaning process. In an example, as described below, the plasma-based cleaning process is non-reactive to the trenches 212 of the substrate 204 exposed by the gaps 210.

In accordance with one embodiment, the plasma-based cleaning process is non-reactive to exposed regions of the substrate 204 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks such as mask 202. In another such embodiment, separate mask condensation (densification of the surface layer) and scribed trench cleaning operations are used, e.g., an Ar or non-reactive gas (or the mix) highly-biased plasma treatment for mask condensation is first performed, and then an $Ar+SF_6$ plasma cleaning of a laser scribed trench is performed. This embodiment may be suitable for cases where Ar-cleaning is not sufficient for trench cleaning due to too thick of a mask material.

Referring to operation 106 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the laser scribing process. The patterned mask 208 protects the integrated circuits during the plasma etching.

In accordance with an embodiment of the present invention, plasma etching the semiconductor wafer through the gaps involves plasma etching a single crystalline silicon wafer. In one such embodiment, a ratio of an etch rate of the single crystalline silicon wafer to an etch rate of the mask 202 is approximately in the range of 15:1-170:1 during the plasma etching.

In an embodiment, patterning the mask 202 with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which is generally a fluorine-based gas such as $SF_6$, $C_4F_8$, $CHF_3$, $XeF_2$, or any other reactant gas capable of etching silicon at a relatively fast etch rate. In an embodiment, the light-absorbing water soluble patterned mask 208 is removed after the singulation process, as depicted in FIG. 2C, and as is described in greater detail below. In another embodiment, the plasma etching operation described in association with FIG. 2C employs a conventional Bosch-type dep/etch/dep process to etch through the substrate 204. Generally, a Bosch-type process consists of three sub-operations: deposition, a directional bombardment etch, and isotropic chemical etch which is run through many iterations (cycles) until silicon is etched through.

In an embodiment, following the singulation process, the patterned mask 208 is removed. In an embodiment, the patterned mask 208 is removed using an aqueous solution. In one such embodiment, the patterned mask 208 is removed by a hot aqueous treatment, such as a hot water treatment. In a specific embodiment, the patterned mask 208 is removed in a hot water treatment at a temperature approximately in the range of 40-100 degrees Celsius. In a particular embodiment, the patterned mask 208 is removed in a hot water treatment at a temperature approximately in the range of 80-90 degrees Celsius. It is to be appreciated that the hotter the temperature of the water, the less time may be needed for the hot water treatment. In accordance with an embodiment of the present invention, a plasma cleaning process can also be performed after etching to aid in the removal of the patterned mask 208.

It is to be appreciated that other circumstances may benefit from a lower water treatment temperature. For example, in the case that a wafer for dicing is supported on a dicing tape that may be impacted by a higher temperature water treatment (e.g., through loss of adhesion), a relatively lower water treatment temperature may be employed, albeit for a longer duration that a relatively higher water treatment temperature. In one such embodiment, the water treatment is between room temperature (i.e., the water is un-heated), but below a temperature of approximately 40 degrees Celsius. In a specific such embodiment, the patterned mask 208 is removed in a warm water treatment at a temperature approximately in the range of 35-40 degrees Celsius.

Accordingly, referring again to Flowchart 100 and FIGS. 2A-2C, wafer dicing may be preformed by initial ablation to ablate through an mask 202, through wafer streets (including metallization), and partially into a silicon substrate. Die singulation may then be completed by subsequent through-silicon deep plasma etching. A specific example of a materials stack for dicing is described below in association with FIGS. 5A-5D, in accordance with an embodiment of the present invention.

Figure 5A:
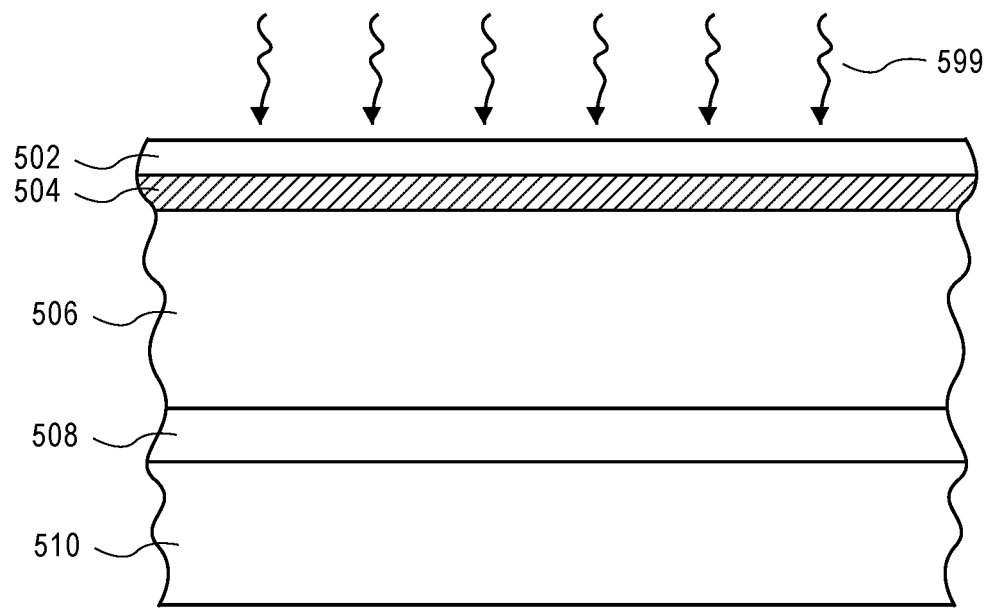
FIGS. 5A-5D illustrate cross-sectional views of various operations in a method of dicing a semiconductor wafer, in accordance with an embodiment of the present invention.

Referring to FIG. 5A, a materials stack for hybrid laser ablation and plasma etch dicing includes a mask 502, a device layer 504, and a substrate 506. The mask layer 502, device layer 504, and substrate 506 are disposed above a die attach film 508 which is affixed to a backing tape 510. In other embodiments, direct coupling to a standard dicing tape is used. In an embodiment, the mask 502 is one such as described above in association with mask 202. The device layer 504 includes an inorganic dielectric layer (such as silicon dioxide) disposed above one or more metal layers (such as copper layers) and one or more low K dielectric layers (such as carbon-doped oxide layers). The device layer 504 also includes streets arranged between integrated circuits, the streets including the same or similar layers to the integrated circuits. The substrate 506 is a bulk single-crystalline silicon substrate. In an embodiment, the mask 502 is fabricated using a thermal treatment or bake 599, such as described above.

In an embodiment, the bulk single-crystalline silicon substrate 506 is thinned from the backside prior to being affixed to the die attach film 508. The thinning may be performed by a backside grind process. In one embodiment, the bulk single-crystalline silicon substrate 506 is thinned to a thickness approximately in the range of 50-100 microns. It is important to note that, in an embodiment, the thinning is performed prior to a laser ablation and plasma etch dicing process. In an embodiment, the mask 502 has a thickness approximately in the range of 1-5 microns and the device layer 504 has a thickness approximately in the range of 2-3 microns. In an embodiment, the die attach film 508 (or any suitable substitute capable of bonding a thinned or thin wafer or substrate to the backing tape 510, such as dicing tapes consisting of an upper adhesive layer and a base film) has a thickness approximately in the range of 10-200 microns.

Figure 5B:
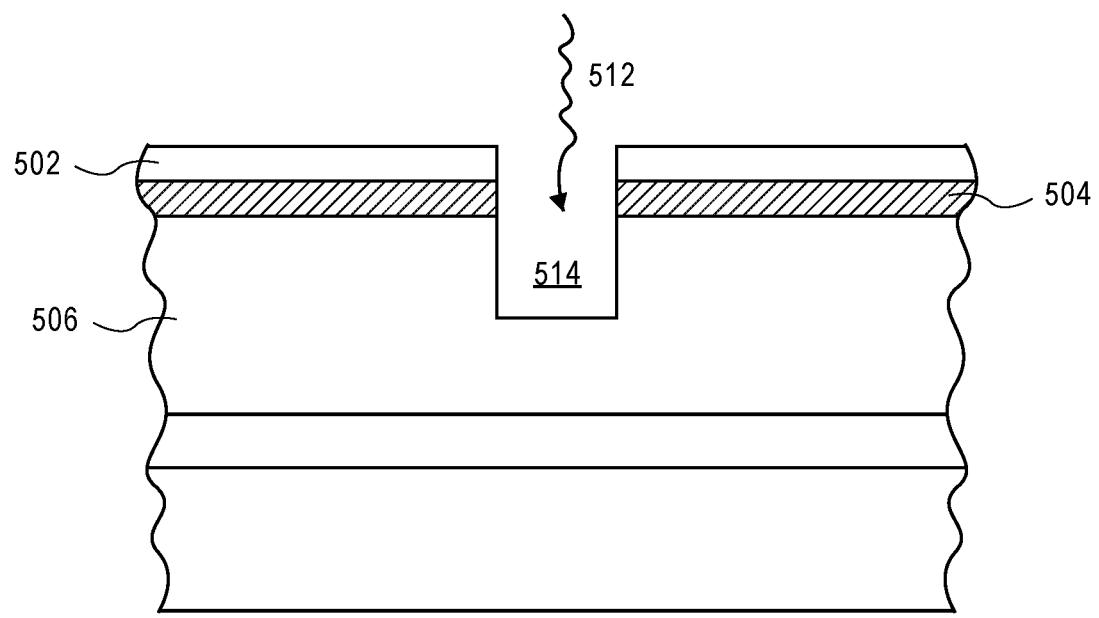

Referring to FIG. 5B, the mask 502, the device layer 504 and a portion of the substrate 506 are patterned with a laser scribing process 512 to form trenches 514 in the substrate 506.

Figure 5C:
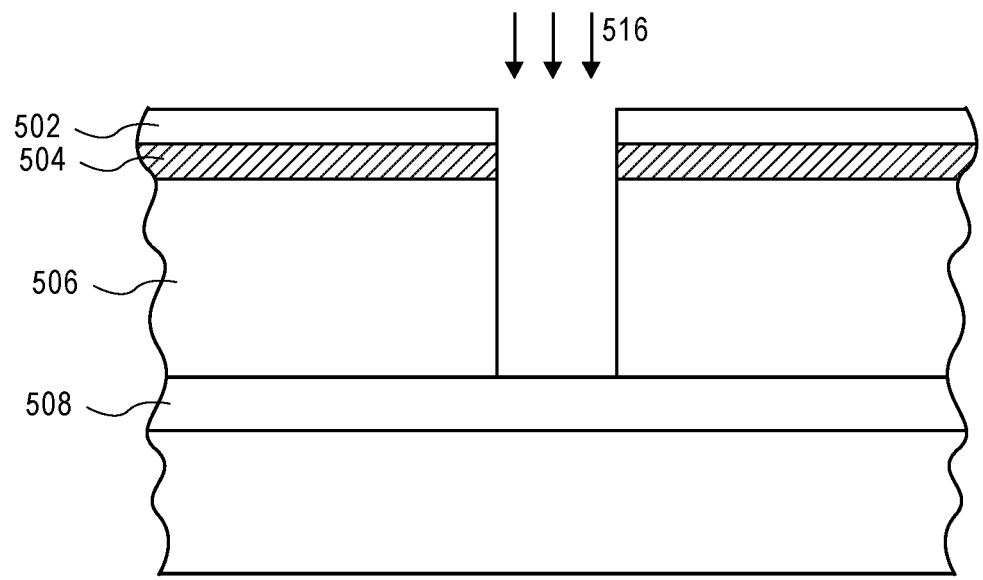

Referring to FIG. 5C, a through-silicon deep plasma etch process 516 is used to extend the trench 514 down to the die attach film 508, exposing the top portion of the die attach film 508 and singulating the silicon substrate 506. The device layer 504 is protected by the mask 502 during the through-silicon deep plasma etch process 516.

Figure 5D:
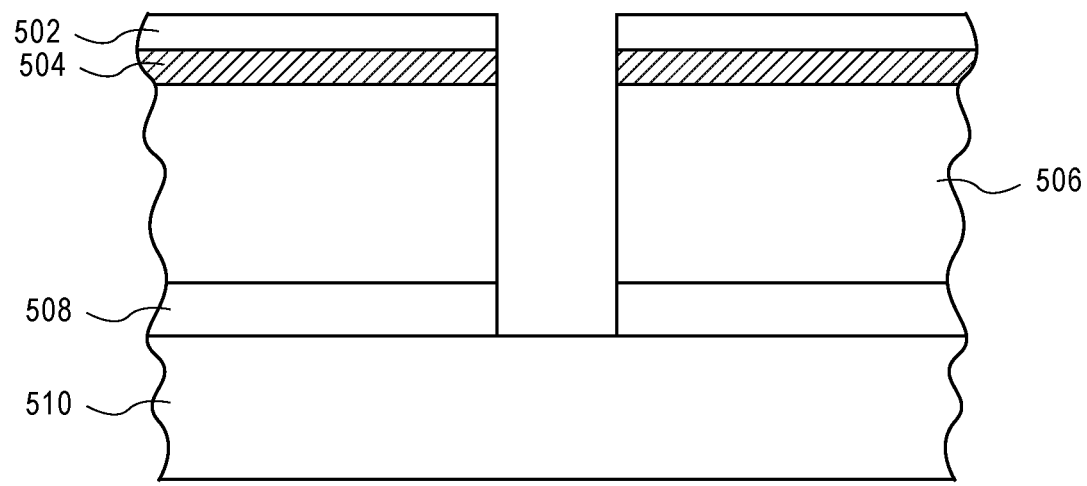

Referring to FIG. 5D, the singulation process may further include patterning the die attach film 508, exposing the top portion of the backing tape 510 and singulating the die attach film 508. In an embodiment, the die attach film is singulated by a laser process or by an etch process. Further embodiments may include subsequently removing the singulated portions of substrate 506 (e.g., as individual integrated circuits) from the backing tape 510. In one embodiment, the singulated die attach film 508 is retained on the back sides of the singulated portions of substrate 506. In an alternative embodiment, in the case that substrate 506 is thinner than approximately 50 microns, the laser scribing process 512 is used to completely singulate substrate 506 without the use of an additional plasma process. Embodiments may further include removing the mask 502 from the device layer 504. Removal of the mask 502 can be as described above for removal of the patterned mask 208.

A single process tool may be configured to perform many or all of the operations in a hybrid laser ablation and plasma etch singulation process utilizing a light-absorbing water soluble mask. For example, FIG. 6 illustrates a block diagram of a tool layout for laser and plasma dicing of wafers or substrates, in accordance with an embodiment of the present invention.

Figure 6:
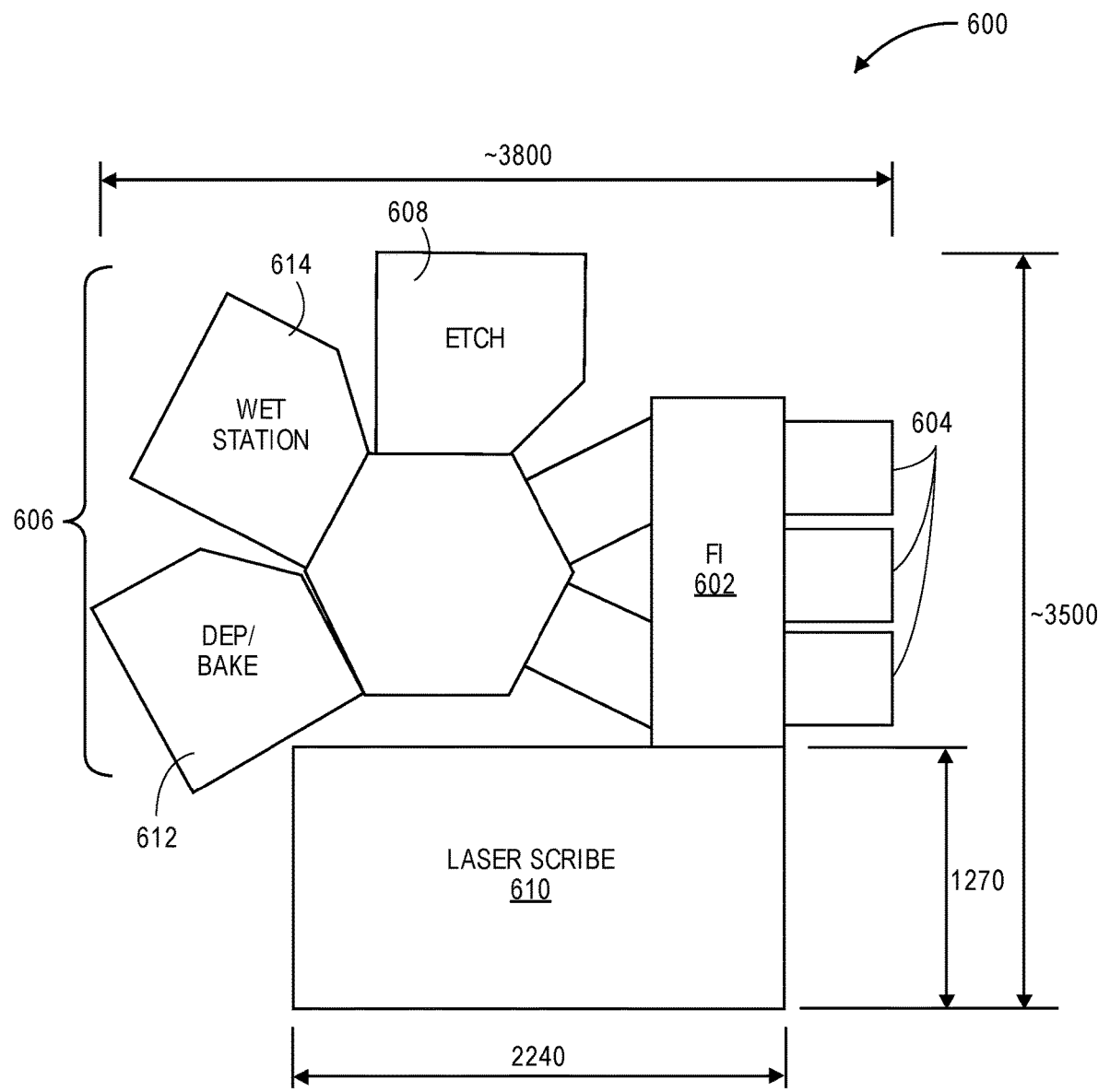
FIG. 6 illustrates a block diagram of a tool layout for laser and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a laser assembly configured to provide a femto-second based laser beam. In an embodiment, the laser is suitable for performing a laser ablation portion of a hybrid laser and etch singulation process, such as the laser ablation processes described above. In one embodiment, a moveable stage is also included in laser scribe apparatus 610, the moveable stage configured for moving a wafer or substrate (or a carrier thereof) relative to the laser. In a specific embodiment, the laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is configured for etching a wafer or substrate through the gaps in a patterned mask to singulate a plurality of integrated circuits. In one such embodiment, the one or more plasma etch chambers 608 is configured to perform a deep silicon etch process. In a specific embodiment, the one or more plasma etch chambers 608 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, a deposition and/or bake chamber 612 is included. The deposition and/or bake chamber 612 may be configured for mask deposition on or above a device layer of a wafer or substrate prior to laser scribing of the wafer or substrate. Such a mask material may be baked prior to the dicing process, as is described above. Such a mask material may be water soluble, as is also described above.

In an embodiment, referring again to FIG. 6, a wet station 614 is included. The wet station may be suitable for cleaning performing a room temperature or a hot aqueous treatment for removing a light-absorbing water soluble mask, as is described above, subsequent to a laser scribe and plasma etch singulation process of a substrate or wafer, or subsequent to a laser scribe-only singulation process. In an embodiment, although not depicted, a metrology station is also included as a component of process tool 600. The cleaning chamber can include atomized mist and/or megasonics nozzle hardware that adds a physical component to the cleaning process, enhancing the dissolution rate of the mask.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
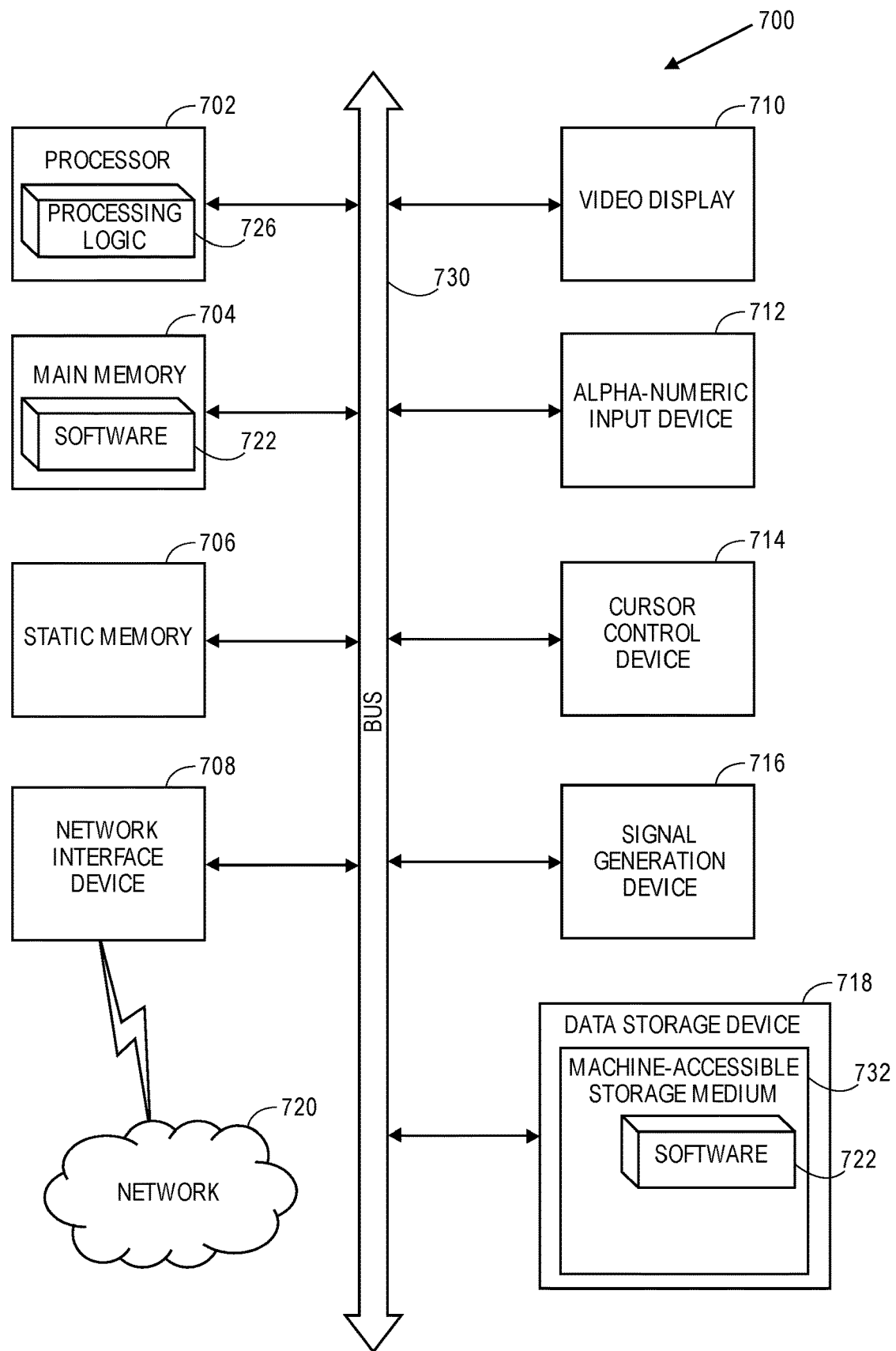
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits, such as one or more of the methods described herein.

Thus, hybrid wafer dicing approaches using a laser scribing process and plasma etch process implementing a light-absorbing mask have been disclosed.

What is claimed is:

1. A method of dicing a semiconductor wafer comprising a plurality of integrated circuits, the method comprising:
   forming a mask above the semiconductor wafer, the mask comprising a transparent water-soluble matrix based on a solid component and water, and the mask comprising a light-absorber species throughout the transparent water-soluble matrix;
   patterning the mask and a portion of the semiconductor wafer with a laser scribing process to provide a patterned mask with gaps and corresponding trenches in the semiconductor wafer in regions between the integrated circuits, wherein patterning the mask with the laser scribing process comprises patterning with a laser beam, wherein the light-absorber species of the mask confines a first portion of the laser beam to the mask during the patterning, and wherein a second portion of the laser beam is confined to the semiconductor wafer during the patterning; and
   plasma etching the semiconductor wafer through the gaps in the patterned mask to extend the trenches and to singulate the integrated circuits, wherein the patterned mask protects the integrated circuits during the plasma etching.

2. The method of claim 1, wherein the laser beam is a Gaussian beam, wherein the light-absorber species of the mask confines a trailing portion of the Gaussian beam to the mask during the patterning, and wherein a leading portion of the Gaussian beam is confined to the semiconductor wafer during the patterning.

3. The method of claim 1, wherein the light-absorber species is a water soluble dye dissolved in the transparent water-soluble matrix.

4. The method of claim 1, wherein the light-absorber species is a nano-dispersion of pigments throughout the transparent water-soluble matrix.

5. The method of claim 1, wherein the mask further comprises a plurality of particles dispersed throughout the transparent water-soluble matrix, wherein a ratio of weight % of the solid component to weight % of the plurality of particles is in a range of 1:0.1-1:4.

6. The method of claim 5, wherein the plurality of particles has an average diameter in a range of 5-100 nanometers.

7. The method of claim 6, wherein the plurality of particles of the mask does not interfere with the laser scribing process during the patterning of the mask with the laser scribing process.

8. The method of claim 5, wherein plasma etching the semiconductor wafer comprises plasma etching a single crystalline silicon wafer, and wherein a ratio of an etch rate of the single crystalline silicon wafer to an etch rate of the mask is in a range of 15:1-170:1 during the plasma etching.

9. The method of claim 1, wherein forming the mask above the semiconductor wafer comprises spin-coating the mask on the semiconductor wafer.

10. The method of claim 1, further comprising:
    subsequent to plasma etching the semiconductor wafer, removing the patterned mask using an aqueous solution.

11. The method of claim 1, further comprising:
subsequent to patterning the mask and prior to plasma etching the semiconductor wafer through the gaps in the patterned mask to singulate the integrated circuits, cleaning the trenches in the semiconductor wafer with a plasma cleaning process.

12. A method of dicing a semiconductor wafer comprising a plurality of integrated circuits, the method comprising:
forming a mask above the semiconductor wafer, the mask comprising a transparent water-soluble matrix based on a solid component and water, and the mask comprising a light-absorber species throughout the transparent water-soluble matrix; and
patterning the mask and singulating the integrated circuits of the semiconductor wafer with a laser scribing process, wherein patterning the mask with the laser scribing process comprises patterning with a laser beam, wherein the light-absorber species of the mask confines a first portion of the laser beam to the mask during the patterning, and wherein a second portion of the laser beam is confined to the semiconductor wafer during the patterning.

13. The method of claim 12, wherein the laser beam is a Gaussian beam, wherein the light-absorber species of the mask confines a trailing portion of the Gaussian beam to the mask during the patterning, and wherein a leading portion of the Gaussian beam is confined to the semiconductor wafer during the patterning.

14. The method of claim 12, wherein the light-absorber species is a water soluble dye dissolved in the transparent water-soluble matrix.

15. The method of claim 12, wherein the light-absorber species is a nano-dispersion of pigments throughout the transparent water-soluble matrix.

16. The method of claim 12, wherein forming the mask above the semiconductor wafer comprises spin-coating the mask on the semiconductor wafer.

17. The method of claim 12, further comprising:
subsequent to patterning the mask and singulating the integrated circuits of the semiconductor wafer with the laser scribing process, removing the patterned mask using an aqueous solution.

* * * * *